(12) United States Patent
Burkland et al.

(10) Patent No.: US 6,954,160 B1
(45) Date of Patent: Oct. 11, 2005

(54) FILTER FOR DIGITALLY PROCESSING AN ANALOG INPUT SIGNAL WITH ANALOG FEEDBACK

(75) Inventors: William A. Burkland, Huxley, IA (US); Jonathan S. McCalmont, Ames, IA (US)

(73) Assignee: Micrel, Inc., San Jose, CA (US)

(*) Notice: Subject to any disclaimer, the term of this patent is extended or adjusted under 35 U.S.C. 154(b) by 1 day.

(21) Appl. No.: 10/821,465

(22) Filed: Apr. 9, 2004

(51) Int. Cl.[7] ............................................... H03M 3/00

(52) U.S. Cl. ........................................ 341/143; 341/155
(58) Field of Search ........................ 341/136, 139, 341/143, 155, 166

(56) References Cited

U.S. PATENT DOCUMENTS

| | | | |
|---|---|---|---|
| 5,187,482 A * | 2/1993 | Tiemann et al. | 341/143 |
| 5,896,101 A * | 4/1999 | Melanson | 341/143 |
| 6,002,352 A * | 12/1999 | El-Ghoroury et al. | 341/139 |
| 6,147,634 A * | 11/2000 | Rangan et al. | 341/143 |
| 6,396,428 B1 * | 5/2002 | Cheng | 341/143 |
| 6,611,570 B1 * | 8/2003 | Subramanian | 375/326 |
| 6,621,436 B2 * | 9/2003 | Yamamoto | 341/143 |
| 6,700,519 B2 * | 3/2004 | Yamamoto | 341/143 |

OTHER PUBLICATIONS

Feldman, A., "A 13-Bit, 1.4-MS/s Sigma-Delta Modulator for RF Baseband Channel Applications", IEEE Journal of Solid State Circuits, Oct. 1998, vol. 33, No. 10, pp. 1462-1469.
Hoffman, A., et al., "Mathematical Time Approach of a First Order Sigma-Delta Modulator", Feb. 9, 1998, pp. 1-4.
Jarman, D., "A Brief Introduction to Sigma Delta Conversion", Intersil Corporation, May 1995, pp. 1-7.
"Digital-analog converters are a "bit" analog", Maxim, May 2003, pp. 40, 42.
"About oversampling, noise shaping, digital filtering, and decimation", Maxim, May 2003, pp. 38-39.

* cited by examiner

Primary Examiner—Michael Tokar
Assistant Examiner—Linh V Nguyen
(74) Attorney, Agent, or Firm—Fenwick & West LLP

(57) ABSTRACT

A filter is described for digitally processing an analog input signal with analog feedback. In one example, the filter uses a topology similar to a second order universal filter block and includes a signal combiner for producing an analog output signal based upon an analog input signal and one or more analog feedback signals. An analog to digital converter processes the analog output signal into a digital data stream which is digitally processed to produce one or more digital output signals which are converted to one or more analog feedback signals. The digital processing can include a bandpass transfer function and a lowpass transfer function. The filter may be implemented in mixed-signal CMOS using standard CMOS processing techniques.

13 Claims, 5 Drawing Sheets

Input: Two's Complement
Output: One Bit
 HI = + 5V
 LO = − 5V

FILTER FOR DIGITALLY PROCESSING AN ANALOG INPUT SIGNAL WITH ANALOG FEEDBACK

FIELD OF THE INVENTION

The invention relates generally to filtering analog input signals using a digital filter.

BACKGROUND OF INVENTION

Many applications implemented in integrated circuits (ICs) require filtering of analog signals. Stable filters that can be implemented using standard CMOS processing technology without requiring accurate matching of analog components are highly desirable.

A common active analog filter used in integrated circuits is the switched-capacitor IC filter. The switched-capacitor IC filter rapidly charges and discharges a capacitor to create a resistance equivalent to that used in a passive filter. The filter can thus be tuned by changing the switch clocking frequency. Although they alleviate the problems of producing high value resistors on a semiconductor wafer, these filters are generally noisy. Additionally, although these filters provide flexibility in changing the effective resistance value in accordance with adjusting the switching rate, these switched-capacitor filters must still be accurately matched (e.g. impedance) with other analog components.

It is highly desirable to use digital filtering of analog input signals to avoid the matching problems of analog filters. Furthermore, it is easier to implement programmable filters in the digital domain than in the analog domain. Digital filters that use feed forward paths from the input signal are stable. However, digital filters with feedback loops can be unstable.

It is highly desirable to have a stable filter for analog signals that incorporate feedback while alleviating the matching requirements of associated with analog filters.

SUMMARY OF THE INVENTION

The present invention provides embodiments of a system and a method for filtering an analog input signal using a digital filter and analog feedback. A system for filtering an analog input signal using a digital filter and analog feedback in accordance with an embodiment of the present invention comprises a signal combiner for producing an analog output signal based upon an analog input signal and one or more analog feedback signals, an analog-to-digital converter for converting the analog output signal into a digital data stream, the converter being communicatively coupled to receive the analog output signal from the signal combiner; a digital signal processing unit for filtering the digital data stream being communicatively coupled to receive the digital data stream from the converter and to send at least one digital output signal to an analog feedback module for producing the one or more analog feedback signals based on the at least one digital output signal; and the analog feedback module being communicatively coupled to send the one or more analog feedback signals to the signal combiner.

A method for filtering an analog input signal using a digital filter and analog feedback in accordance with an embodiment of the present invention comprises producing an analog output signal based upon an analog input signal and one or more analog feedback signals, converting the analog output signal into a digital data stream, applying a first digital transfer function to the digital data stream resulting in a first digital output signal, and converting the first digital output signal to one of the one or more analog feedback signals.

BRIEF DESCRIPTION OF THE DRAWINGS

The figures depict one or more embodiments of the present invention for purposes of illustration only. One skilled in the art will readily recognize from the following discussion that alternative embodiments of the structures and methods illustrated herein may be employed without departing from the principles of the invention.

DETAILED DESCRIPTION OF THE DRAWINGS

Figure 1:
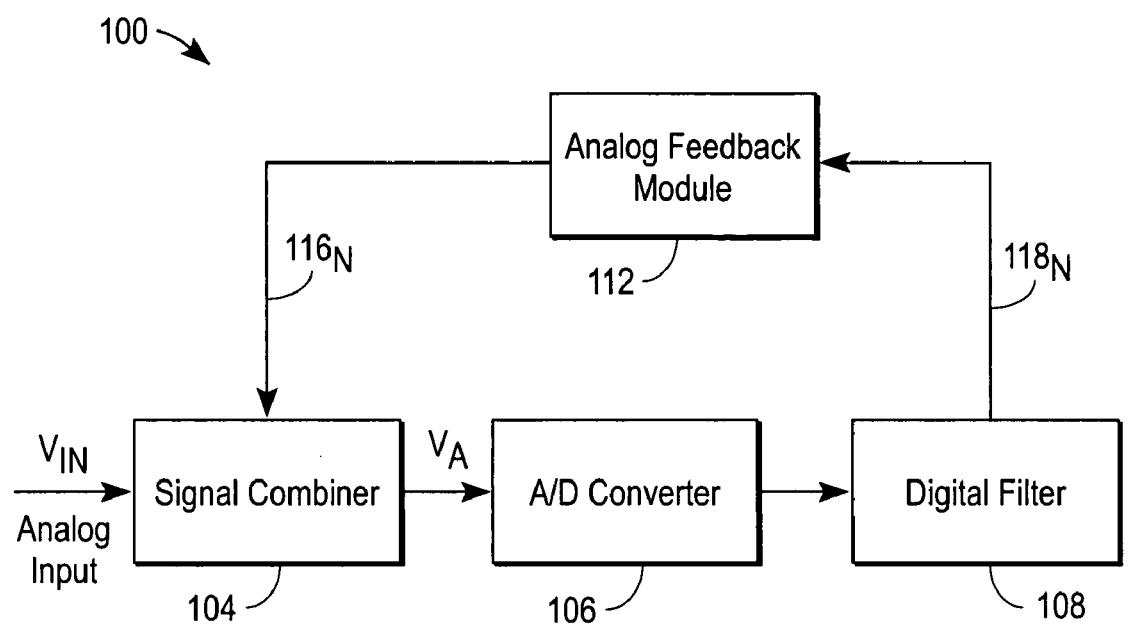
FIG. 1 illustrates a block diagram of a system for filtering an analog input signal using a digital filter and analog feedback in accordance with an embodiment of the present invention.

FIG. 1 illustrates a block diagram of a system 100 for filtering an analog input signal using a digital filter and analog feedback in accordance with an embodiment of the present invention. The system comprises a signal combiner 104 for producing an analog output signal $V_A$ based upon an analog input signal $V_{IN}$ and one or more analog feedback signals $116_N$, an analog-to-digital converter 106, a digital filter 108, and an analog feedback module 112. The signal combiner 104 receives the analog input signal $V_{IN}$ and is communicatively coupled to receive the one or more analog feedback signals $116_N$, from the analog feedback module 112. The A/D Converter 106 is communicatively coupled to the signal combiner 104 to receive analog output signal $V_A$ which it 106 converts into a digital data stream of a number of bits (e.g. one bit). Digital filter 108 is communicatively coupled to the A/D Converter 106 to receive the digital version of $V_A$ for digital signal processing. The analog feedback module 112 is communicatively coupled to receive one or more output digital signals $118_N$ from the digital filter 108 which it processes into the one or more analog feedback signals $116_N$ sent to the signal combiner 104.

Figure 2:
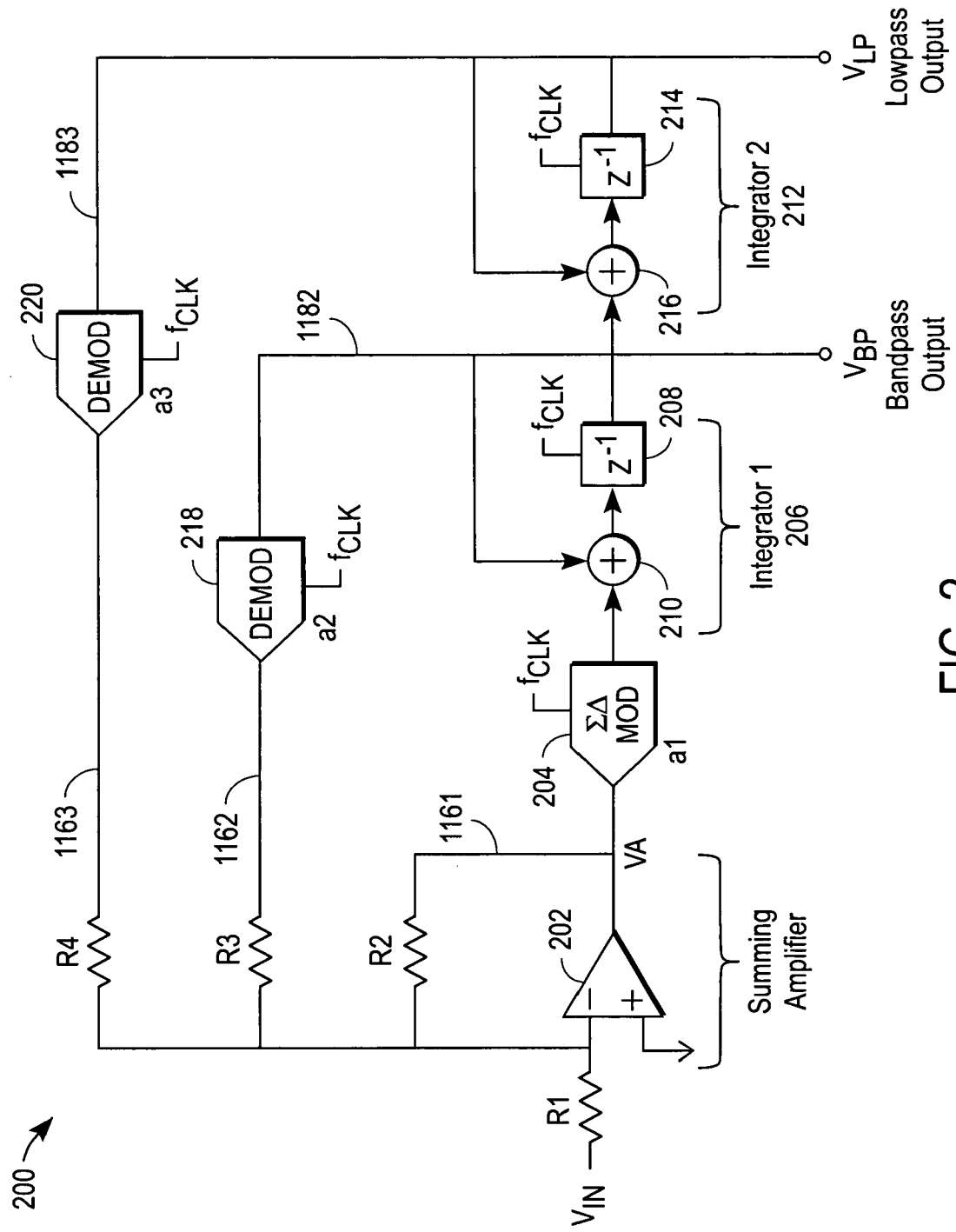
FIG. 2 illustrates a system for digitally filtering an analog input signal and providing analog feedback in accordance with another embodiment of the present invention.

FIG. 2 illustrates a system 200 in accordance with another embodiment of the present invention including a feedback circuit including analog circuitry. The filter illustrated in FIG. 2 uses a topology similar to a second order universal block filter. Moreover, the filter in FIG. 2 may be implemented using standard complementary metal-oxide semiconductor (CMOS) circuitry processing and/or mixed-signal CMOS.

The system 200 comprises a summing amplifier 202, a sigma-delta modulator 204 having a gain $a_1$, a first integrator 206, a first demodulator 218 having a gain $a_2$, a second integrator 212, a second demodulator 220 having a gain $a_3$, and resistances $R_1$, $R_2$, $R_3$ and $R_4$. The summing amplifier 202, an example of a signal combiner 104, receives an analog input signal $V_{IN}$ over input resistance $R_1$. The summing amplifier 202, which in this example is implemented as an operational amplifier, has its positive input grounded and its negative input connected to receive $V_{IN}$ and analog feedback signals $116_1$, $116_2$ and $116_3$ respectively over feedback resistances $R_2$, $R_3$ and $R_4$. In this embodiment, a sigma-delta modulator 204 performs analog to digital conversion. The modulator 204 converts an analog input signal into a digital data stream by modulating the output pulse density. The sigma-delta modulator has a clock frequency, $f_{clk}$, that is set at a rate (e.g. at least the Nyquist frequency of twice the center frequency $f_o$ desired for the passband) for sampling the input signal. The design of a sigma-delta modulator is generally such that resolution in time can be traded for resolution in amplitude, allowing imprecise analog components to be used without degrading the resulting output. The sigma-delta modulator 204 receives the analog output signal, samples it at a frequency derived from the clock frequency $f_{clk}$ by which the modulator 204 operates, and produces a digital data stream of a number of bits. In this illustrated example, the number of bits is one so that the digital data stream is a one-bit digital data stream. The sigma-delta modulator 204 also applies a gain factor of $a_1$ to the digital data stream. This embodiment 200 includes two integrators 206, 212 for digital filtering. A first integrator 206 including, a digital signal combiner 210 and a digital unit delay represented by $z^{-1}$ 208, receives the one-bit gain-added digital data stream. The digital output signal 1182 from digital unit delay represented by $z^{-1}$ 208 is combined by the digital signal combiner 210 with the digital version of $V_A$ so that the bit being received by the digital signal combiner 210 is added to one or more previous bit signals resulting in a digital bandpass output signal $V_{BP}$. This digital output signal $118_2$ may also be output to another circuit for processing. As illustrated in FIG. 2, the digital signal $118_2$ is also forwarded to a first demodulator 218 which converts the digital bandpass output signal $V_{BP}$ into the analog feedback signal $116_2$ which includes an added gain of $a_2$. The analog feedback signal $116_2$ is transferred across feedback resistance $R_3$ to the input of the summing amplifier 202. The resistances in this system may be implemented in any of a number of ways including via active devices, passive devices or a combination thereof. In one example, the resistances are implemented as switched capacitances.

Another communication path is also provided for the digital bandpass output signal $V_{BP}$. The second integrator 212 receives the bandpass output signal $V_{BP}$. In this example, the integrator 212 also comprises a digital signal combiner 216 for receiving $V_{BP}$ and a digital unit delay represented by $z^{-1}$ 214 so that the bit being received by the integrator is added to one or more previous bit signals resulting in a digital lowpass output signal $V_{LP}$. This digital lowpass output signal $V_{LP}$ may be output to another circuit for processing. As illustrated in FIG. 2, this digital output signal $118_2$ is also forwarded to a second demodulator 220 which converts the digital output signal $118_2$ into the analog feedback signal $116_3$ including an added gain of $a_3$. This analog feedback signal $116_3$ is transferred across feedback resistance $R_4$ to the input of the summing amplifier 202. The sigma-delta modulator, the integrators, and the demodulators are programmable so that adjustments in the center frequency, sampling rate, and decimation rate may be changed. In this illustration, an embodiment of the analog feedback module 112 includes the demodulators 218 and 220 and the resistances $R_3$ and $R_4$.

A transfer function for this filter can be solved by writing out the equations and reducing to the input/output variables.

$$\frac{V_{IN}}{R_1} + \frac{V_A}{R_2} + \frac{a_2 V_{BP}}{R_3} + \frac{a_3 V_{LP}}{R_4} = O$$

$$(a_1 V_A + V_{BP})z^{-1} = V_{BP}$$

$$(V_{BP} + V_{LP})z^{-1} = V_{LP}$$

Combining these gives $$\frac{V_{IN}}{R_1} + \frac{z-1}{a_1 R_2} V_{BP} + \frac{a_2}{R_3} V_{BP} + \frac{a_3}{R_4} \frac{1}{z-1} V_{BP} = 0$$

$$-\frac{a_1 R_2}{R_1}(z-1)V_{IN} = \left[(z-1)^2 + \frac{a_1 a_2 R_2}{R_3}(z-1) + \frac{a_1 a_3 R_2}{R_4}\right] V_{BP}$$

$$\frac{V_{BP}}{V_{IN}} = \frac{-\frac{a_1 R_2 (z-1)}{R_1}}{(z-1)^2 + \frac{a_1 a_2 R_2}{R_3}(z-1) + \frac{a_1 a_3 R_2}{R_4}}$$

A second-order bandpass filter will have a transfer function of the form $$G(s) = \frac{H_o \frac{\omega_o}{Q} s}{s^2 + s\frac{\omega_o}{Q} + \omega_o^2}$$

Substitute $$z = e^{sT} \approx 1 + sT \quad T = \frac{1}{f_{clk}}$$

$$\frac{V_{BP}}{V_{IN}} = \frac{-\frac{a_1 R_2}{R_1}(sT)}{(sT)^2 + \frac{a_1 a_2 R_2}{R_3}(sT) + \frac{a_1 a_3 R_2}{R_4}}$$

By inspection $$\omega_O^2 = \left(\frac{a_1 a_3 R_2}{R_4}\right)\frac{1}{T^2}$$

$$\frac{\omega_O}{Q} = \left(\frac{a_1 a_2 R_2}{R_3}\right)\frac{1}{T} \quad Q = \omega_O T\left(\frac{R_3}{a_1 a_2 R_2}\right)$$

$$H_O \frac{\omega_O}{Q} = -\left(\frac{a_1 R_2}{R_1}\right)\frac{1}{T}$$

Therefore:

$$f_O = \frac{f_{clk}}{2\pi}\sqrt{\frac{a_1 a_3 R_2}{R_4}}$$

$$Q = \frac{R_3}{a_1 a_2 R_2}\sqrt{\frac{a_1 a_3 R_2}{R_4}}$$

$$H_{OBP} = \frac{R_3}{a_2 R_1}$$

Solving for the transfer function to the low pass output gives the same $f_o$ and Q, but $$H_{OLP} = -\frac{R_4}{a_3 R_1}$$

Figure 3:
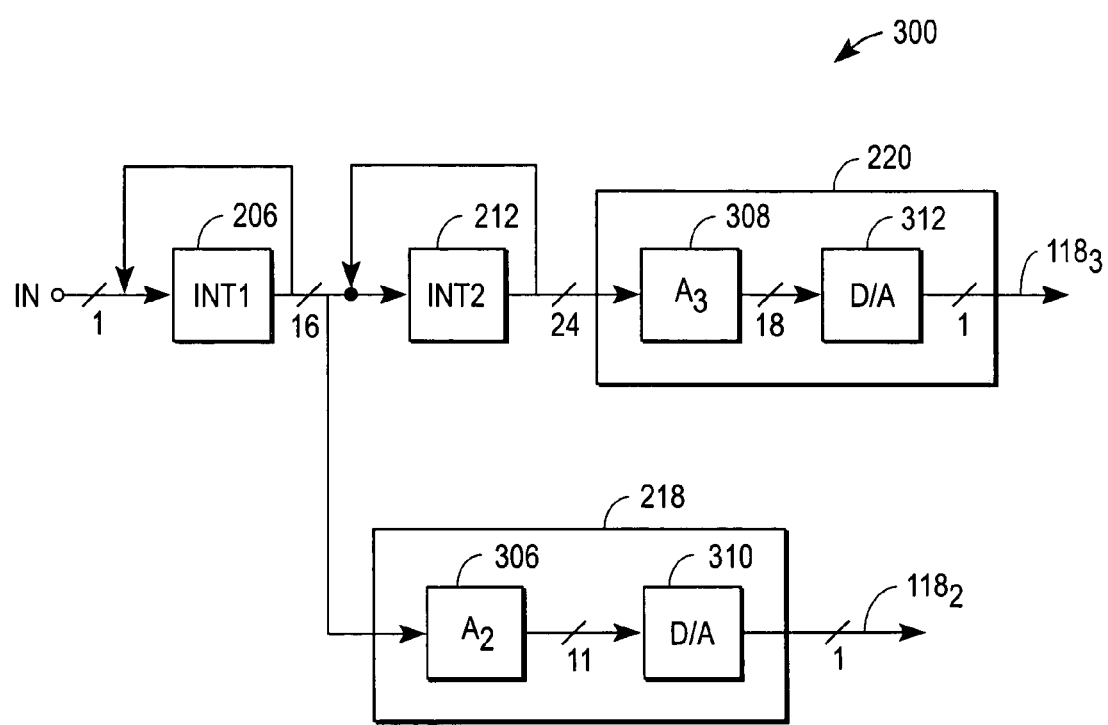
FIG. 3 illustrates examples of an analog feedback module for use in a system in accordance with embodiments of the present invention.

FIG. 3 illustrates two examples 220, 218 of an analog feedback module 112 for use in a system in accordance with an embodiment of the present invention such as the system embodiment 200. For illustrative purposes, these examples 220, 218 are discussed in the context of FIG. 2. The feedback module or demodulator 218 includes a first gain module 306 and a digital to analog (D/A) converter 310 which receives the digital bandpass signal $V_{BP}$ from integrator 206. The feedback module or demodulator 220 includes a first gain module 308 and a digital to analog (D/A) converter 312 which receives the digital lowpass signal $V_{LP}$ from integrator 212.

Integrator 206 may be embodied as a 16-bit integrator. The $A_2$ gain module 306 is coupled to receive the digital bandpass output signal $V_{BP}$ from the first integrator 206 and add gain to the signal in order to generate a gain added digital bandpass output signal. In one embodiment, each of the gain modules 306 and 308 may be implemented by a bit shifter that shifts its respective digital output signal in two's complement form a number of bits to the left, the number of bits representing a respective gain factor. For example, the gain module 306 shifts the 16 bits output from integrator 206 5 bits to the left for a gain of $2^5$. The D/A converter 310 is coupled to the $A_2$ gain module 306 to receive the gain added digital bandpass output signal and converts it to analog form which as illustrated in FIG. 2 is coupled via resistance $R_3$ to an analog feedback input of the summing amplifier 202.

As illustrated in the embodiment for FIG. 3, integrator 212 may be embodied as a 24-bit integrator. $A_3$ gain module 308 is coupled to receive the digital lowpass output signal $V_{LP}$ from the second integrator 212 and adds gain to the signal in order to generate a gain added digital lowpass output signal. The $A_3$ gain module 308 includes a bit shifter that shifts the 24 bits output from the second integrator 212 six (6) bits to the left for a gain of $2^6$. D/A converter 312 is coupled to the $A_3$ gain module 308 to receive the gain added digital lowpass output signal and convert it to analog form which as illustrated in FIG. 2 is coupled via resistance $R_4$ to an analog feedback input of the summing amplifier 202.

Figure 4:
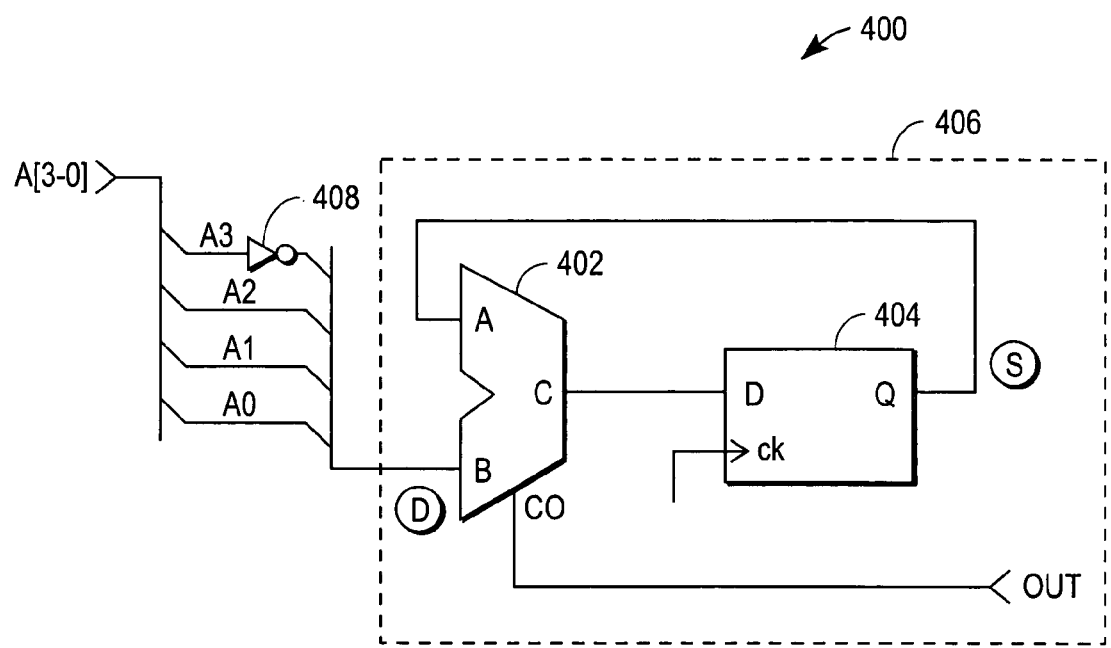
FIG. 4 illustrates an example of a digital-to-analog converter for use as a demodulator in a system for digitally filtering an analog input signal and providing analog feedback in accordance with another embodiment of the present invention.

FIG. 4 illustrates an example of a digital-to-analog converter for use in a demodulator (e.g. 218, 220) in a system (e.g., 200) in accordance with an embodiment of the present invention. In particular, FIG. 4 illustrates an example of a 4-bit D/A converter 400 which inverts a top bit A3 408 to convert the input from two's complement to unsigned binary. The bits (A3-A0) are then fed as an input signal D to an input B of integrator 406 which includes a comparator 402 which receives input D via input B and a D flip-flop 404 which is triggered by the output C of the comparator 402. The carry out signal of the integrator from the carryout output CO of comparator 402 is an analog feedback signal which feeds directly to a resistance (e.g., resistance $R_3$ or $R_4$).

In another version of the system embodiment of FIG. 2, either or both of integrators 206 and 212 may include an up-down counter such as the illustrated example 406 that generates a carryout signal output in two's complement form which is sent out a carryout signal output (CO) to be forwarded to a gain module. In the implementation example wherein the first integrator 206 is implemented as a 16-bit integrator including an up-down counter, if the counter 406 reaches +1023d or −1024d, it limits or clips the output to prevent the count from increasing or decreasing further. The output of the counter is therefore two's complement as is the carryout signal.

To calculate the gain of the demodulator, an example is useful. Consider the 4-bit demodulator 400:

The two's complement input has a range from −8 (1000) to +7 (0111). Consider the case where A=5 (0101). After inverting the most significant bit (MSB), the input to the integrator is 1101. Assume for this example, a one or hi is represented by +5 volts (V) and a zero or lo is represented by −5V.

| D | S | OUT |
|---|---|-----|
| 0000 | 0000 | 0 |
| 1101 | 1101 | 0 |
| 1101 | 1010 | 1 |
| 1101 | 0111 | 1 |
| 1101 | 0100 | 1 |
| 1101 | 0001 | 1 |
| 1101 | 1110 | 0 |
| 1101 | 1011 | 1 |
| 1101 | 1000 | 1 |
| 1101 | 0101 | 1 |
| 1101 | 0010 | 1 |
| 1101 | 1111 | 0 |
| 1101 | 1100 | 1 |
| 1101 | 1001 | 1 |
| 1101 | 0110 | 1 |
| 1101 | 0011 | 1 |
| 1101 | 0000 | 1 |

The output sequence repeats after 16 clock cycles. There are three zeros and thirteen ones, or $$\frac{3(-5)}{16} + \frac{13(5)}{16} = \frac{50}{16} = 5\left[\frac{V(1) - V(0)}{2^4}\right]$$

In general, the gain will be $$\text{OUT} = D\left(\frac{V(1) - V(0)}{2^N}\right)$$

where the output signal (OUT) is the one-bit output, D the input, V(1) the voltage of a one at the output, V(0) the voltage of a zero at the output, and N the number of bits in the integrator. The gain and the demodulator can effectively be combined in an FPGA implementation example wherein the number of bits for the demodulator is arbitrary so that a user can program the number of bits as desired.

For the circuit depicted in FIG. 2, the following parameters provide an example implementation design.

$R_1 = R_3 = R_4 = 470 K\Omega$ $R_2 = 4.7 K\Omega$ $\alpha_1 = 4$ (demodulator gain for $V_{REF} = 0.25V$)

$$a_2 = \frac{10}{2^{16}}(2^5) = \frac{10}{2048}$$

$$a_3 = \frac{10}{2^{24}}(2^6) = \frac{10}{2^{18}} = \frac{10}{262144}$$

$$f_{clk} = \frac{1}{T} = 10^6 \text{ Hz}$$

thus $f_o = 197$ Hz $Q = 6.4$ $H_{OBP} = -205$ $H_{OLP} = -26200$

Figure 5:
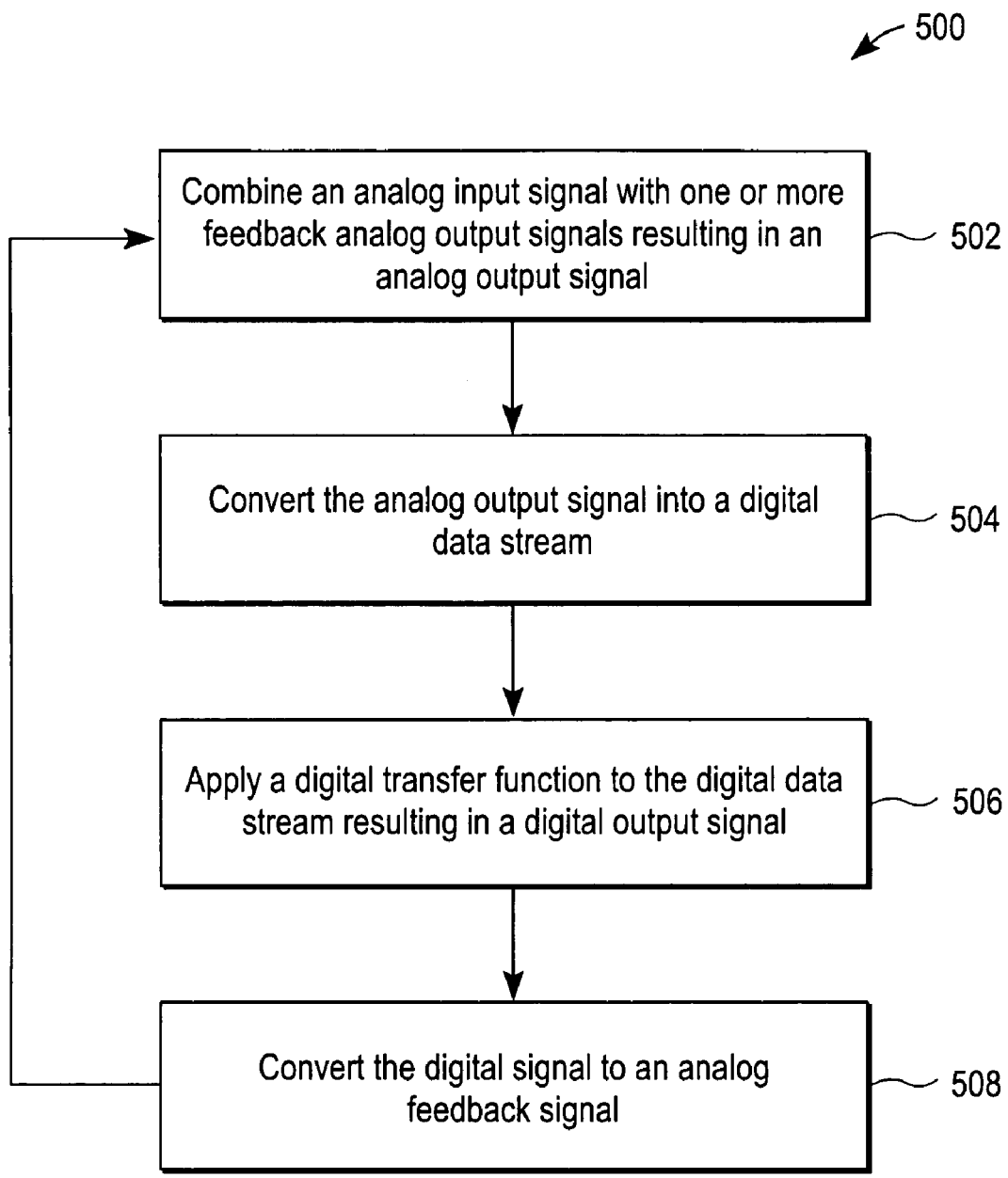
FIG. 5 illustrates a method for filtering an analog input signal using a digital filter and analog feedback in accordance with another embodiment of the present invention.

FIG. 5 illustrates a method 500 for filtering an analog input signal using a digital filter and analog feedback in accordance with an embodiment of the present invention. For illustrative purposes, the method is described in the context of FIG. 1 with references to the embodiment of FIG. 2 as well. The signal combiner 104 (e.g., summing amplifier 202) produces 502 an analog output signal $V_A$ based upon an analog input signal $V_{IN}$ and one or more analog feedback signals. A/D converter 106 (e.g., sigma delta modulator 204) converts the analog output signal $V_A$ into a digital data stream. The digital filter 108 (e.g. integrator 206 and/or integrator 212) applies 506 a digital transfer function to the digital data stream resulting in a first digital output signal $118_N$. An example of a transfer function is a bandpass function as may be implemented by integrator 206 or a low-pass transfer function as may be implemented by integrators 206 and 212 in combination. The analog feedback module 112 (e.g. demodulator 218 or demodulator 204) converts 508 the digital output signal $118_N$ to one of the one or more analog feedback signals $116_N$.

Although the elements are depicted as individual units, any combination of the elements of the transfer logic may be implemented in a field programmable gate array (FPGA), a digital signal processing (DSP) integrated circuit, software, hardware, firmware or any combination thereof and/or stored in any other type of computer usable medium.

The foregoing description of the embodiments of the present invention has been presented for the purposes of illustration and description. It is not intended to be exhaustive or to limit the present invention to the precise form disclosed. Many modifications and variations are possible in light of the above teaching. It is intended that the scope of the present invention be limited not by this detailed description, but rather by the hereto appended claims.

What is claimed is:

1. A system for filtering an analog input signal using a digital filter and analog feedback comprising:
    a signal combiner for producing an analog output signal based upon an analog input signal and one or more analog feedback signals, the signal combiner having at least one input for receiving an analog input signal and the one or more analog feedback signals, and an output for outputting the analog output signal;
    an analog-to-digital converter for converting the analog output signal into a digital data stream, the converter being communicatively coupled to receive the analog output signal from the signal combiner;
    a digital signal processing unit for filtering the digital data stream being communicatively coupled to receive the digital data stream from the converter and to send at least one digital output signal to an analog feedback module for producing the one or more analog feedback signals based on the at least one digital output signal;
    the analog feedback module being communicatively coupled to send the one or more analog feedback signals to the at least one input of the signal combiner; and
    a transfer function unit for receiving the digital data stream and applying a filter function, the transfer function unit further comprising:
    a first integrator communicatively coupled to receive the digital data stream from the converter for generating a first digital output signal; and
    a second integrator communicatively coupled to receive the first digital output signal from the first integrator wherein the second integrator generates a second digital output signal.

2. The digital signal processing unit of claim 1 wherein the first integrator comprises an up down counter for generating the first digital output signal as a first carry out signal in two's complement form and wherein the second integrator comprises an up-down counter for generating the second digital output signal as a second carry out signal in two's complement form.

3. The digital signal processing unit of claim 2 wherein a first gain module is coupled to receive the first digital output signal from the first integrator and is also coupled to send the first digital output signal with a respective gain factor to the analog feedback module wherein the first gain module is a bit shifter that shifts its respective digital output signal in two's complement form a number of bits to the left, the number of bits representing the respective gain factor.

4. The digital signal processing unit of claim 3 wherein a second gain module is coupled to receive the second digital output signal from the second integrator and is also coupled to send the second digital output signal with a respective gain factor to the analog feedback module wherein the second gain module is a bit shifter that shifts its respective digital output signal in two's complement form a number of bits to the left, the number of bits representing the respective gain factor.

5. The digital signal processing unit of claim 1 wherein the output of the transfer function is a second order bandpass filtered signal.

6. The digital signal processing unit of claim 1 wherein the output of the transfer function unit is a lowpass filtered signal.

7. A system for filtering an analog input signal using a digital filter and analog feedback comprising:

a signal combiner for producing an analog output signal based upon an analog input signal and one or more analog feedback signals, the signal combiner having at least one input for receiving an analog input signal and the one or more analog feedback signals, and an output for outputting the analog output signal;

an analog-to-digital converter for converting the analog output signal into a digital data stream, the converter being communicatively coupled to receive the analog output signal from the signal combiner;

a digital signal processing unit for filtering the digital data stream being communicatively coupled to receive the digital data stream from the converter and to send at least one digital output signal to an analog feedback module for producing the one or more analog feedback signals based on the at least one digital output signal;

the analog feedback module being communicatively coupled to send the one or more analog feedback signals to the at least one input of the signal combiner; and a second digital to analog converter for converting a second digital output signal to a second analog feedback signal, the second digital to analog converter being coupled to receive the second digital output signal and being coupled to send the second analog feedback signal to the at least one input of the signal combiner.

8. A system for filtering an analog input signal using a digital filter and analog feedback comprising:

a signal combiner for producing an analog output signal based upon an analog input signal and one or more analog feedback signals, the signal combiner having at least one input for receiving an analog input signal and the one or more analog feedback signals, and an output for outputting the analog output signal;

an analog-to-digital converter for converting the analog output signal into a digital data stream, the converter being communicatively coupled to receive the analog output signal from the signal combiner;

a digital signal processing unit for filtering the digital data stream being communicatively coupled to receive the digital data stream from the converter and to send at least one digital output signal to an analog feedback module for producing the one or more analog feedback signals based on the at least one digital output signal;

the analog feedback module being communicatively coupled to send the one or more analog feedback signals to the at least one input of the signal combiner;

a digital to analog converter for converting the digital output signal to an analog feedback signal, the digital to analog converter being coupled to receive the digital output signal and being coupled to send the analog feedback signal to the at least one input of the signal combiner; and a resistance across which an analog feedback signal is transferred from the digital to analog converter to the at least one input of the signal combiner.

9. The system of claim 8 wherein the resistance is implemented as a switched capacitance.

10. A method for filtering an analog input signal using a digital filter and analog feedback comprising:

producing an analog output signal based upon an analog input signal and one or more analog feedback signals;

converting the analog output signal into a digital data stream;

applying a first digital transfer function to the digital data stream resulting in a first digital output signal;

converting the first digital output signal to one of the one or more analog feedback signals, wherein applying a first digital transfer function to the digital data stream resulting in a first digital output signal comprises:

applying a second order bandpass filter transfer function.

11. A method for filtering an analog input signal using a digital filter and analog feedback comprising:

producing an analog output signal based upon an analog input signal and one or more analog feedback signals;

converting the analog output signal into a digital data stream;

applying a first digital transfer function to the digital data stream resulting in a first digital output signal;

converting the first digital output signal to one of the one or more analog feedback signals;

applying a second digital transfer function to the digital data stream resulting in a second digital output signal; and wherein applying a second digital transfer function to the digital data stream resulting in a second digital output signal comprises:

applying a lowpass filter transfer function.

12. A method for filtering an analog input signal using a digital filter and analog feedback comprising:

producing an analog output signal based upon an analog input signal and one or more analog feedback signals;

converting the analog output signal into a digital data stream;

applying a first digital transfer function to the digital data stream resulting in a first digital output signal;

converting the first digital output signal to one of the one or more analog feedback signals;

applying a second digital transfer function to the digital data stream resulting in a second digital output signal; and wherein applying a first digital transfer function to the digital data stream resulting in a first digital output signal includes generating the first digital output signal as a first carry out signal in two's complement form and wherein applying a second digital transfer function to the digital data stream resulting in a second digital output signal includes generating the second digital output signal as a second carry out signal in two's complement form.

13. A system for filtering an analog input signal using a digital filter and analog feedback comprising:

means for producing an analog output signal based upon an analog input signal and one or more analog feedback signals;

means for converting the analog output signal into a digital data stream;

means for digitally filtering the digital data stream resulting in a first digital output signal; and means for converting the first digital output signal to one of the one or more analog feedback signals, wherein the means for digitally filtering the digital data stream further comprises means for applying a filter function being communicatively coupled to receive the digital data stream, the means for applying a filter function further comprising:

means for generating a first digital output signal being communicatively coupled to receive the digital data stream from the means for converting;

means for generating a second digital output signal being communicatively coupled to receive the first digital output signal from the means for generating a first digital output signal; and wherein the means for producing the one or more analog feedback signals comprises means for converting the first digital output signal to a first analog feedback signal being coupled to receive the first digital output signal and being coupled to send the first analog feedback signal to the means for producing an analog output signal; and means for converting the second digital output signal to a second analog feedback signal being coupled to receive the second digital output signal and being coupled to send the second analog feedback signal to the means for producing an analog output signal.

* * * * *